(12) United States Patent
Yoshida et al.

(10) Patent No.: US 12,469,815 B2
(45) Date of Patent: Nov. 11, 2025

(54) SEMICONDUCTOR PACKAGE

(71) Applicants:Kabushiki Kaisha Toshiba, Tokyo (JP); Toshiba Electronic Devices & Storage Corporation, Tokyo (JP)

(72) Inventors: Satoshi Yoshida, Kanagawa (JP); Tatsunori Sakano, Tokyo (JP); Ryohei Gejo, Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 463 days.

(21) Appl. No.: 18/168,795

(22) Filed: Feb. 14, 2023

(65) Prior Publication Data
US 2024/0055386 A1  Feb. 15, 2024

(30) Foreign Application Priority Data
Aug. 10, 2022  (JP) ................. 2022-127742

(51) Int. Cl.
*H01L 23/00* (2006.01)
*H01L 23/492* (2006.01)
(Continued)

(52) U.S. Cl.
CPC ............ *H01L 24/32* (2013.01); *H01L 23/492* (2013.01); *H01L 23/498* (2013.01);
(Continued)

(58) Field of Classification Search
CPC ..... H01L 24/83; H01L 23/5226; H01L 24/29; H01L 23/492; H01L 25/072;
(Continued)

(56) References Cited

U.S. PATENT DOCUMENTS

| 5,610,439 A | 3/1997 | Hiyoshi et al. |
| 5,874,750 A | 2/1999 | Yanagisawa et al. |
| 2002/0154482 A1 | 10/2002 | Miyake et al. |
| 2005/0093173 A1* | 5/2005 | Miller ............... H01L 25/16 257/E23.07 |

(Continued)

FOREIGN PATENT DOCUMENTS

| JP | H08-88240 A | 4/1996 |
| JP | H09-135023 A | 5/1997 |

(Continued)

*Primary Examiner* — Mouloucoulaye Inoussa
(74) *Attorney, Agent, or Firm* — Kim & Stewart LLP

(57) ABSTRACT

According to one embodiment, a semiconductor package includes a first conductive member, a second conductive member, a plurality of semiconductor devices, a wiring member, a first connection member, and a second connection member. The plurality of semiconductor devices is provided between the first conductive member and the second conductive member. One of the semiconductor devices includes a semiconductor member, a first electrode, a first control electrode, a second control electrode, and a second electrode. The first and second conductive members are electrically connected to the first and second electrodes, respectively. The wiring member includes first, second and third wiring layers, and an insulating region. A part of the insulating region is located between the first wiring layer and the third wiring layer, and between the third wiring layer and the second wiring layer. The second wiring layer includes a first connection region and a second connection region.

20 Claims, 12 Drawing Sheets

(51) Int. Cl.
*H01L 23/498* (2006.01)
*H01L 23/522* (2006.01)
*H01L 25/07* (2006.01)

(52) U.S. Cl.
CPC .......... *H01L 23/5226* (2013.01); *H01L 24/29* (2013.01); *H01L 25/072* (2013.01); *H01L 2224/29147* (2013.01); *H01L 2224/2918* (2013.01); *H01L 2224/32245* (2013.01); *H01L 2924/13055* (2013.01)

(58) Field of Classification Search
CPC ... H01L 23/498; H01L 24/32; H01L 23/5385; H01L 24/81; H01L 24/92; H01L 23/3675; H01L 23/49816; H01L 23/5384; H01L 24/27; H01L 25/0652; H01L 24/16; H01L 24/75; H01L 24/24; H01L 23/66; H01L 23/5386; H01L 23/5383; H01L 23/49822; H01L 23/552; H01L 24/06; H01L 25/0657; H01L 23/3128; H01L 2224/29147; H01L 2924/13055; H01L 2224/32245; H01L 2224/2918; H01L 2224/8385; H01L 2224/11849; H01L 2224/75745; H01L 2224/2919; H01L 2224/9205; H01L 2924/30107; H01L 2224/24137; H01L 2223/6627; H01L 2224/48091; H01L 2224/0401; H01L 2924/15311; H01L 2224/32225; H01L 2224/04042; H01L 2224/32145; H01L 2924/15192; H01P 3/026; H01P 3/081; H01P 3/082; H03H 7/0115; H03H 2001/0085
See application file for complete search history.

(56) References Cited

U.S. PATENT DOCUMENTS

| | | | |
|---|---|---|---|
| 2006/0163648 A1* | 7/2006 | Hauenstein | H01L 23/488 257/E23.012 |
| 2008/0239685 A1* | 10/2008 | Kawabe | H01G 4/33 361/782 |
| 2011/0298020 A1* | 12/2011 | Kajiwara | H01L 23/49555 257/288 |
| 2013/0193464 A1* | 8/2013 | Bae | H10H 20/857 257/94 |
| 2015/0131255 A1* | 5/2015 | Do | H01L 24/49 361/783 |
| 2016/0260680 A1* | 9/2016 | Sakata | H01L 23/5385 |
| 2017/0117252 A1* | 4/2017 | Baik | H01L 24/06 |
| 2018/0159023 A1* | 6/2018 | Suh | H10N 50/80 |
| 2019/0081162 A1* | 3/2019 | Gejo | H10D 64/117 |
| 2019/0115269 A1* | 4/2019 | Pan | H01L 23/04 |
| 2021/0281258 A1* | 9/2021 | Sakano | H03K 17/063 |
| 2021/0343634 A1* | 11/2021 | Choi | H01L 23/49838 |
| 2021/0391452 A1* | 12/2021 | Kato | H10D 64/117 |
| 2021/0407914 A1* | 12/2021 | Hsu | H01L 23/66 |
| 2022/0093485 A1* | 3/2022 | Kobayashi | H01L 25/18 |
| 2022/0093543 A1* | 3/2022 | Seo | H01L 24/81 |
| 2022/0189916 A1* | 6/2022 | Jung | H01L 24/73 |
| 2022/0392878 A1* | 12/2022 | Park | H01L 24/32 |
| 2023/0005842 A1* | 1/2023 | Kim | H01L 23/5383 |
| 2023/0006057 A1* | 1/2023 | Gejo | H10D 12/481 |
| 2023/0012399 A1* | 1/2023 | Lee | H01L 24/20 |
| 2023/0171900 A1* | 6/2023 | Choi | H05K 1/115 |
| 2023/0420395 A1* | 12/2023 | Lin | H01L 23/5384 |
| 2024/0297153 A1* | 9/2024 | Yoshida | H01L 25/072 |
| 2024/0347508 A1* | 10/2024 | Lim | H01L 24/32 |

FOREIGN PATENT DOCUMENTS

| JP | 2002-222916 A | 8/2002 |
|---|---|---|
| JP | 2016-219521 A | 12/2016 |

* cited by examiner

SEMICONDUCTOR PACKAGE

CROSS-REFERENCE TO RELATED APPLICATIONS

This application is based upon and claims the benefit of priority from Japanese Patent Application No. 2022-127742, filed on Aug. 10, 2022; the entire contents of which are incorporated herein by reference.

FIELD

Embodiments of described herein generally relate to a semiconductor package.

BACKGROUND

Stable characteristics are desired in semiconductor packages including semiconductor devices such as IGBTs (insulated gate bipolar transistors).

DETAILED DESCRIPTION

Figure 1:
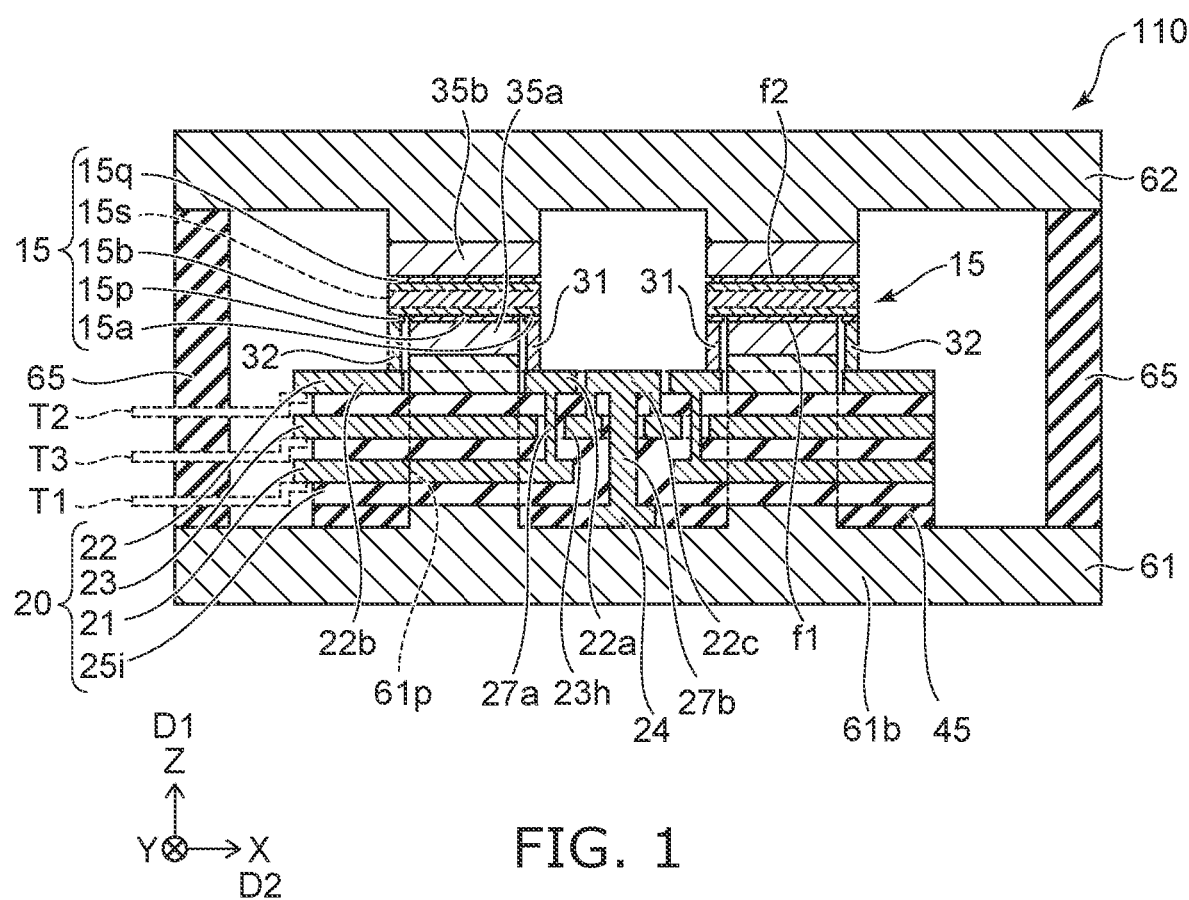
FIG. 1 is a schematic cross-sectional view illustrating a semiconductor package according to a first embodiment.

According to one embodiment, a semiconductor package includes a first conductive member, a second conductive member, a plurality of semiconductor devices, a wiring member, a first connection member, and a second connection member. The plurality of semiconductor devices is provided between the first conductive member and the second conductive member. One of the plurality of semiconductor devices includes a semiconductor member, a first electrode provided between the first conductive member and the semiconductor member, a first control electrode provided between the first conductive member and the semiconductor member, a second control electrode provided between the first conductive member and the semiconductor member, and a second electrode provided between the semiconductor member and the second conductive member. The first conductive member is electrically connected to the first electrode. The second conductive member is electrically connected to the second electrode. A direction from the second control electrode to the first control electrode crosses a first direction from the first conductive member to the second conductive member. The wiring member includes a first wiring layer, a second wiring layer, a third wiring layer, and an insulating region. A direction from the first wiring layer to the second wiring layer and a direction from the first wiring layer to the third wiring layer are along the first direction. At least a part of the insulating region is located between the first wiring layer and the third wiring layer, and between the third wiring layer and the second wiring layer. A position of the second wiring layer in the first direction is between a position of the insulating region in the first direction and a position of the plurality of semiconductor devices in the first direction. The second wiring layer includes a first connection region and a second connection region. The first connection region is electrically connected to the first wiring layer. The third wiring layer is electrically connected to the first conductive member. The first connection member is provided between the first connection region and the first control electrode, and the first connection member electrically connects the first connection region to the first control electrode. The second connection member is provided between the second connection region and the second control electrode, and the second connection member electrically connects the second connection region to the second control electrode.

Embodiments of the present invention will now be described with reference to the drawings.

The drawings are schematic or conceptual, and the relationship between the thickness and width of the respective portions, the ratio of the sizes between the portions, and the like are not necessarily the same as the actual ones. Even when the same part is represented, the dimensions and proportions of each other may be represented differently depending on the drawings.

In the specification of the present application and each of the figures, elements similar to those described above with respect to the previously described figures are denoted by the same reference numerals and a detailed description thereof is omitted as appropriate.

First Embodiment

FIG. 1 is a schematic cross-sectional view illustrating a semiconductor package according to the first embodiment.

Figure 2:
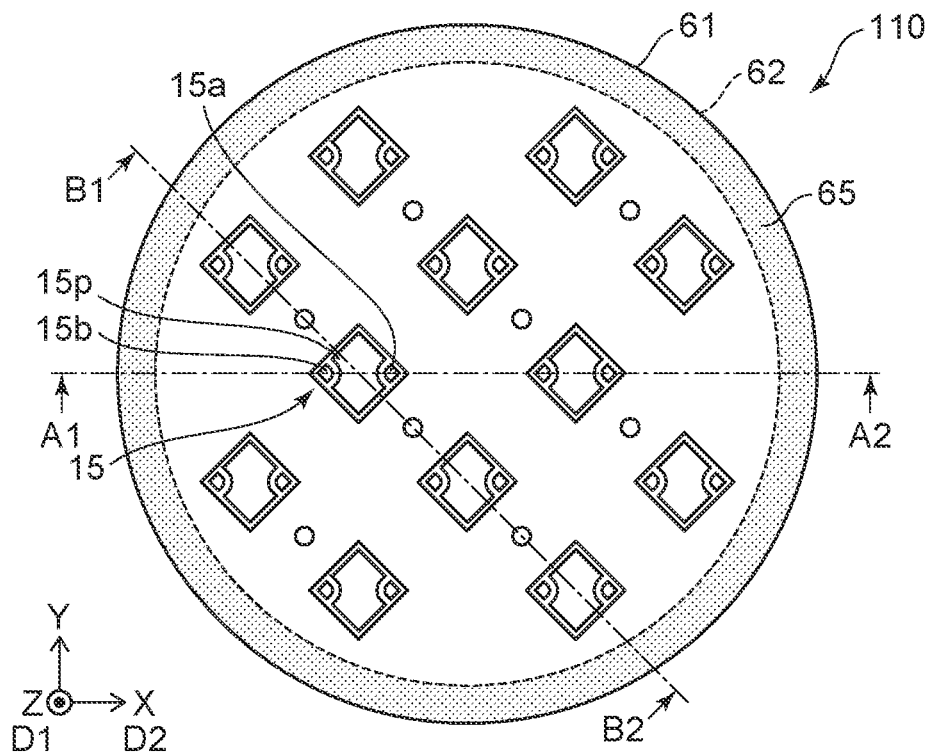
FIG. 2 is a schematic plan view illustrating the semiconductor package according to the first embodiment.

FIG. 2 is a schematic plan view illustrating the semiconductor package according to the first embodiment.

Figure 3:
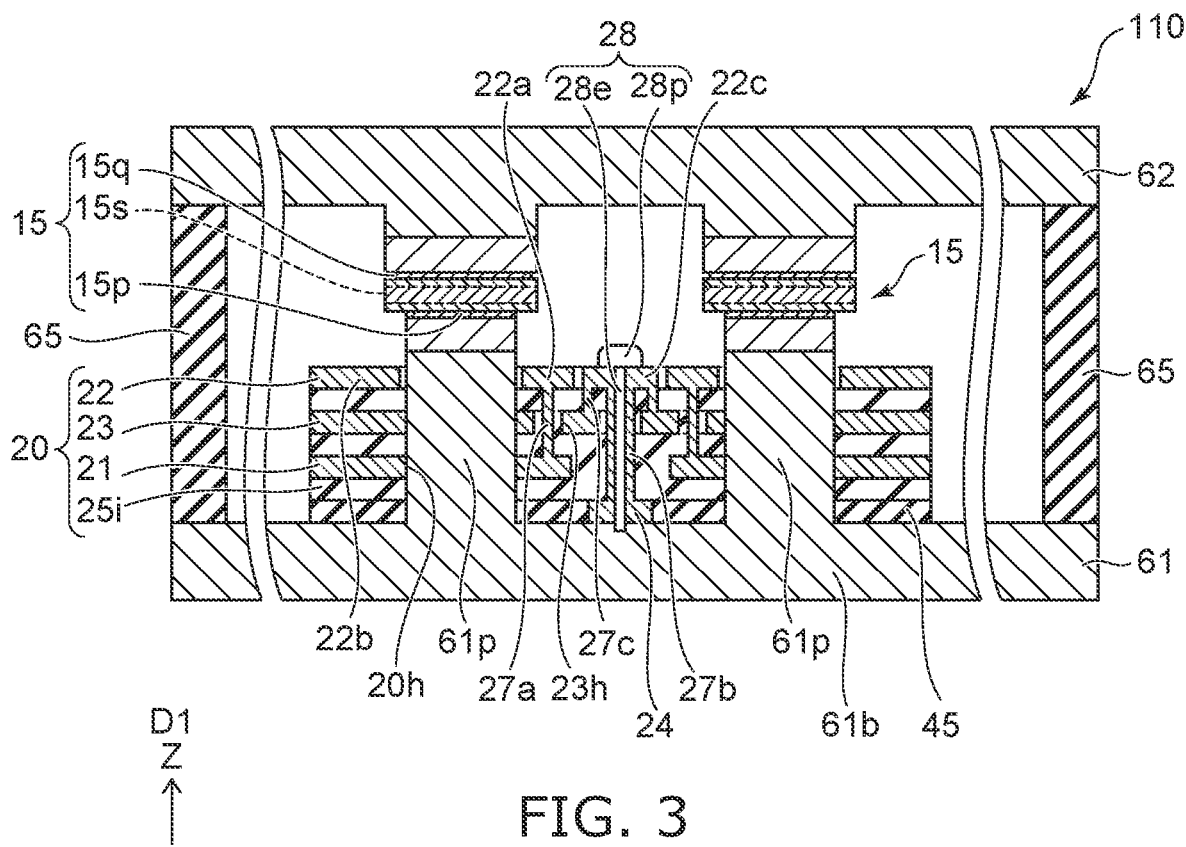
FIG. 3 is a schematic cross-sectional view illustrating the semiconductor package according to the first embodiment.

FIG. 3 is a schematic cross-sectional view illustrating the semiconductor package according to the first embodiment.

FIG. 1 is a cross-sectional view taken along the line A1-A2 of FIG. 2. FIG. 3 is a cross-sectional view taken along the line B1-B2 of FIG. 2.

As shown in FIG. 1, a semiconductor package 110 according to the embodiment includes a first conductive member 61, a second conductive member 62, a plurality of semiconductor devices 15, a wiring member 20, a first connection member 31, and a second connection member 32.

The plurality of semiconductor devices 15 are provided between the first conductive member 61 and the second conductive member 62. A first direction D1 from the first conductive member 61 to the second conductive member 62 is defined as a Z-axis direction. One direction perpendicular to the Z-axis direction is defined as an X-axis direction. The direction perpendicular to the Z-axis direction and the X-axis direction is defined as a Y-axis direction. As shown in FIG. 2, the plurality of semiconductor devices 15 are arranged, for example, in the X-Y plane. FIG. 2 illustrates a state in which the second conductive member 62 is removed.

As shown in FIG. 1, one of the plurality of semiconductor devices 15 includes a semiconductor member 15s, a first electrode 15p, a first control electrode 15a, a second control electrode 15b and a second electrode 15q.

The first electrode 15p is provided between the first conductive member 61 and the semiconductor member 15s. The first control electrode 15a is provided between the first conductive member 61 and the semiconductor member 15s. The second control electrode 15b is provided between the first conductive member 61 and the semiconductor member 15s. The second electrode 15q is provided between the semiconductor member 15s and the second conductive member 62.

For example, one of the multiple semiconductor devices 15 includes a first face f1 and a second face f2. The first face f1 is located between the first conductive member 61 and the second face f2. The second face f2 is located between the first face f1 and the second conductive member 62. The first face f1 faces the first conductive member 61. The second face f2 faces the second conductive member 62.

For example, the first electrode 15p, the first control electrode 15a and the second control electrode 15b are provided at the first face f1. The second electrode 15q is provided at the second face f2.

The first conductive member 61 is electrically connected to the first electrode 15p. The second conductive member 62 is electrically connected to the second electrode 15q.

As shown in FIGS. 1 and 2, a direction from the second control electrode 15b to the first control electrode 15a crosses the first direction D1 (the direction from the first conductive member 61 to the second conductive member 62). In the example of FIGS. 1 and 2, in one of the plurality of semiconductor devices 15 of interest, a direction from the second control electrode 15b to the first control electrode 15a is along a second direction D2. The second direction D2 crosses the first direction D1. In one example, the second direction D2 may be the X-axis direction.

As shown in FIG. 1, the wiring member 20 includes a first wiring layer 21, a second wiring layer 22, a third wiring layer 23 and an insulating region 25i. A direction from the first wiring layer 21 to the second wiring layer 22 and a direction from the third wiring layer 23 to the second wiring layer 22 are along the first direction D1. In this example, the third wiring layer 23 is located between the first wiring layer 21 and the second wiring layer 22.

At least a part of the insulating region 25i is provided between the first wiring layer 21 and the second wiring layer 22 and between the third wiring layer 23 and the second wiring layer 22. The insulating region 25i insulates these wiring layers from each other.

In the wiring member 20, the first wiring layer 21, the second wiring layer 22, the third wiring layer 23 and the insulating region 25i are in contact with each other and may be integrated. The first wiring layer 21, the second wiring layer 22, the third wiring layer 23 and the insulating region 25i may be separated from each other.

A position of the second wiring layer 22 in the first direction D1 is between a position of the insulating region 25i in the first direction D1 and a position of the plurality of semiconductor devices 15 in the first direction D1. The second wiring layer 22 faces the plurality of semiconductor devices 15.

As shown in FIG. 1, the second wiring layer 22 includes a first connection region 22a and a second connection region 22b.

The first connection region 22a is electrically connected to the first wiring layer 21. In this example, the wiring member 20 further includes a first connecting portion 27a. The first connecting portion 27a electrically connects the first wiring layer 21 to the second connection region 22b. At least a part of the first connecting portion 27a extends in the first direction D1 (Z-axis direction) in the insulating region 25i. In this example, the third wiring layer 23 includes a third wiring layer hole 23h. The first connecting portion 27a passes through the third wiring layer hole 23h.

As will be described later, the third wiring layer 23 is electrically connected to the first conductive member 61.

As shown in FIG. 1, the first connection member 31 is provided between the first connection region 22a and the first control electrode 15a. The first connection member 31 electrically connects the first connection region 22a to the first control electrode 15a.

As shown in FIG. 1, the second connection member 32 is provided between the second connection region 22b and the second control electrode 15b. The second connection member 32 electrically connects the second connection region 22b to the second control electrode 15b.

As shown in FIG. 1, the semiconductor package 110 may include a first terminal T1, a second terminal T2 and a third terminal T3. The first terminal T1 is electrically connected to the first wiring layer 21. The second terminal T2 is electrically connected to the second wiring layer 22. The third terminal T3 is electrically connected to the third wiring layer 23.

In the semiconductor package 110, a current (for example, a main current) flowing between the first conductive member 61 and the second conductive member 62 may be controlled by a signal supplied to at least one of the first terminal T1 or the second terminal T2. The current may be controlled by the potential of at least one of the first terminal T1 or the second terminal T2. The signal (or potential) may be a signal (potential) based on the potential of the third terminal T3.

The plurality of semiconductor devices 15 are transistors. For example, the plurality of semiconductor devices 15 may be insulated gate bipolar transistors (IGBTs). The first electrode 15p corresponds to an emitter electrode, for example. The second electrode 15q corresponds to a collector electrode, for example. The first control electrode 15a corresponds to the gate electrode. The second control electrode 15b corresponds to an electrode for controlling the operation.

As described later, a control signal being different from that of the first terminal T1 is input to the second terminal T2. Thereby, for example, the loss at the time of turn-off can be reduced. In this case, when the control signals input to the plurality of semiconductor devices 15 are not uniform, it becomes difficult to reduce the desired loss.

For example, in a reference example, the wiring connected to the first control electrode 15a and the wiring connected to the second control electrode 15b are provided in the same plane. In this case, in the plurality of semiconductor devices 15, the difference in the lengths of these wirings becomes large. Therefore, in the reference example, the reduction of the loss is insufficient.

In the embodiment, the first wiring layer 21 connected to the first control electrode 15a and the second wiring layer 22 connected to the second control electrode 15b may overlap in the first direction D1. As a result, in the plurality of semiconductor devices 15, the difference in the lengths of the wiring layers is suppressed. According to the embodiment, in each of the plurality of semiconductor devices 15, the loss reduction being target can be effectively and stably obtained.

According to the embodiments, losses can be reduced. For example, a semiconductor package capable of obtaining stable characteristics can be provided. For example, the operation of the plurality of semiconductor devices 15 is made uniform. For example, it is easy to obtain high reliability.

As shown in FIG. 1, in this example, the position of the second wiring layer 22 in the first direction D1 is between the position of the first wiring layer 21 in the first direction D1 and the position of the plurality of semiconductor devices 15 in the first direction D1. The position of the third wiring layer 23 in the first direction D1 is between the position of the first wiring layer 21 in the first direction D1 and the position of the second wiring layer 22 in the first direction D1.

For example, the first wiring layer 21, the third wiring layer 23 and the second wiring layer 22 are arranged in this order. Thereby, for example, the parasitic capacitance between the first wiring layer 21 and the third wiring layer 23 becomes substantially the same as the parasitic capacitance between the second wiring layer 22 and the third wiring layer 23. For example, the distortion of the signal supplied to the first wiring layer 21 is close to the distortion of the signal supplied to the second wiring layer 22. Loss can be reduced more stably.

The distance (first distance) between the first wiring layer 21 and the third wiring layer 23 along the first direction D1 may be substantially the same as the distance (second distance) between the third wiring layer 23 and the second wiring layer 22 along the first direction D1. The parasitic capacitance can be substantially the same. In one example, the second distance may be not less than 0.5 tomes and not more than 1.5 times the first distance. In another example, the second distance may be not less than 0.3 times and not more than to 3.0 times the first distance. For example, high mechanical strength can easily be obtained in the wiring member 20.

In the embodiment, the first connection member 31 and the second connection member 32 are preferably elastic members. These wiring members are spring pins, for example. Stable connection is possible.

As shown in FIG. 3, the first conductive member 61 may include a first base portion 61b and a first protruding portion 61p. The first protruding portion 61p is connected to the first base portion 61a. The first protruding portion 61p protrudes toward the second conductive member 62 with the first base portion 61a as a reference.

As shown in FIG. 3, the wiring member 20 includes, for example, a wiring member hole 20h. The first protruding portion 61p passes through the wiring member hole 20h. The end of the first protruding portion 61p faces the plurality of semiconductor devices 15.

As shown in FIGS. 1 and 3, in this example, the semiconductor package 110 includes a first conductive plate 35a and a second conductive plate 35b. The first conductive plate 35a is provided between the first protruding portion 61p and the first electrode 15p. The second conductive plate 35 b is provided between the second electrode 15q and the second conductive member 62. The first conductive plate 35a electrically connects the first protruding portion 61p with the first electrode 15p. The second conductive plate 35b electrically connects the second electrode 15q with the second conductive member 62.

At least one of the first conductive plate 35a or the second conductive plate 35b includes Mo, for example. The first conductive plate 35a and the second conductive plate 35b are, for example, Mo plates. At least one of the first conductive member 61 or the second conductive member 62 includes Cu, for example.

As shown in FIG. 3, the second wiring layer 22 may further include a third connection region 22c. On the other hand, the wiring member 20 may further include a second connecting portion 27b and a fourth wiring layer 24. The insulating region 25i is provided between the fourth wiring layer 24 and the third connection region 22c in the first direction D1. The second connecting portion 27b extends along the first direction D1 in the insulating region 25i. The second connecting portion 27b electrically connects the fourth wiring layer 24 with the third connection region 22c.

In this example, the wiring member 20 further includes a third connecting portion 27c. The third connecting portion 27c extends along the first direction D1 in the insulating region 25i. The third connecting portion 27c electrically connects the third connection region 22c to the third wiring layer 23.

With such a configuration, the third wiring layer 23 is electrically connected to the fourth wiring layer 24 via the third connecting portion 27c, the third connection region 22c, and the second connecting portion 27b. The fourth wiring layer 24 is electrically connected to the first conductive member 61. As shown in FIG. 3, the semiconductor package 110 further includes a fixing member 28 in this example. The fixing member 28 includes a first fixing portion 28p and a first fixing extension portion 28e. The first fixing extension portion 28e is connected with the first fixing portion 28p. For example, the width of the first fixing portion 28p along the second direction D2 is greater than the width of the first fixing extension portion 28e along the second direction D2. The fixing member 28 may be, for example, a screw.

The fourth wiring layer 24, the second connecting portion 27b and the third connection region 22c are located between a part of the first conductive member 61 and the first fixing portion 28p in the first direction D1. The first fixing extension portion 28e passes through the fourth wiring layer 24, the second connecting portion 27b and the third connection region 22c along the first direction D1. The first fixing extension portion 28e is fixed to the part of the first conductive member 61. For example, the wiring member 20 is fixed to the first conductive member 61 by the fixing member 28 (for example, a screw). The fixing member 28 electrically connects the third wiring layer 23 to the first conductive member 61.

As shown in FIGS. 1 and 3, the semiconductor package 110 may further include an insulating plate 45. The insulating plate 45 is provided between the first base portion 61b and the wiring member 20. The insulating plate 45 electrically insulates the first conductive member 61 from the part of the wiring member 20 to be insulated. The insulating plate 45 may include, for example, glass epoxy.

As shown in FIGS. 1 and 3, the semiconductor package 110 may further include an insulating member 65. As shown in FIG. 2, the insulating member 65 is provided around the plurality of semiconductor devices 15 in a plane crossing the first direction D1 (for example, the X-Y plane). At least a part of the insulating member 65 is provided between the first conductive member 61 and the second conductive member 62. The insulating member 65 includes ceramic, for example. The insulating member 65 may be, for example, an insulator. Stable insulation can be obtained.

In the embodiment, a stress directed from the first conductive member 61 to the plurality of semiconductor devices and a stress directed from the second conductive member 62 to the plurality of semiconductor devices 15 are applied to the plurality of semiconductor devices 15. The semiconductor package 110 is, for example, a press-pack semiconductor device (press-pack IGBT).

Thus, in the embodiment, one of the plurality of semiconductor devices 15 is an IGBT. The first electrode 15p functions as the emitter electrode. The second electrode 15q functions as the collector electrode. The current flowing between the first electrode 15p and the second electrode 15q can be controlled by the potential of at least one of the first control electrode 15a and the second control electrode 15b.

Figure 4:
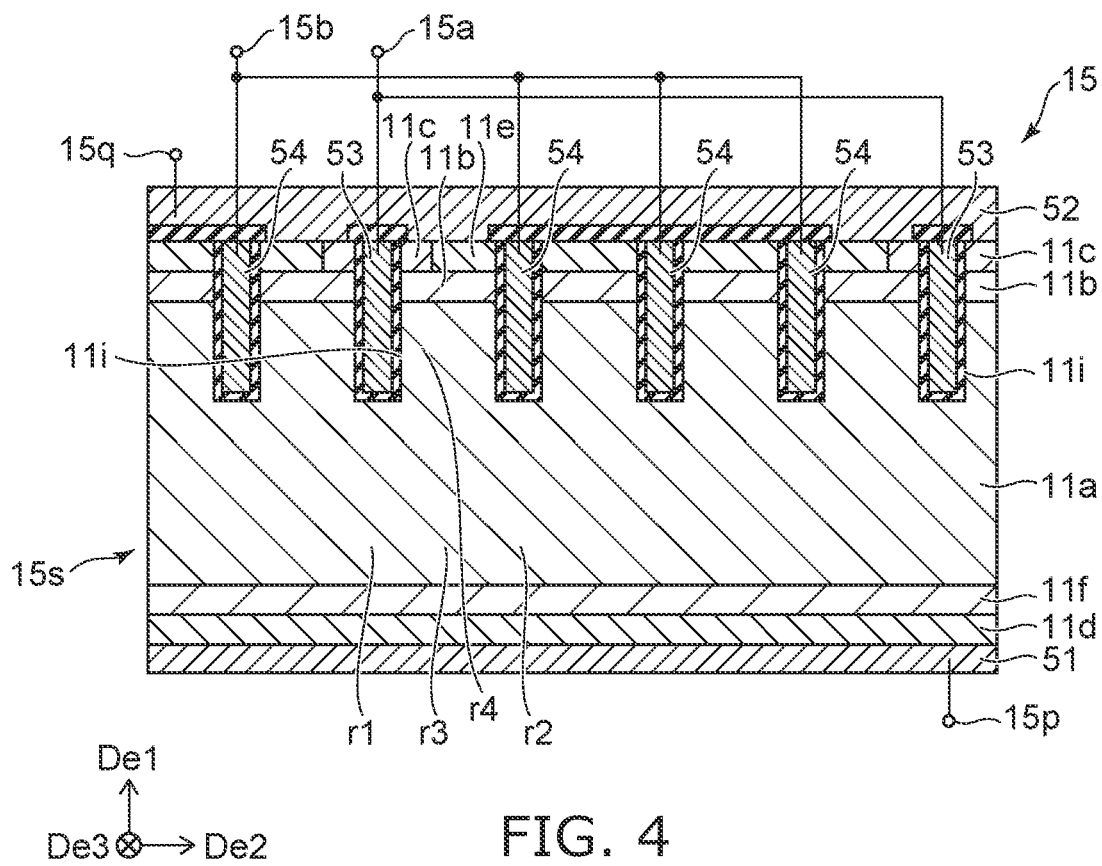
FIG. 4 is a schematic cross-sectional view illustrating a part of the semiconductor package according to the first embodiment.

FIG. 4 is a schematic cross-sectional view illustrating a part of the semiconductor package according to the first embodiment.

FIG. 4 illustrates one of the multiple semiconductor devices 15. As shown in FIG. 4, one of the plurality of semiconductor devices 15 includes a first conductive portion 51, a second conductive portion 52, a third conductive portion 53, a fourth conductive portion 54, and an element insulating portion 11i. A second device direction De2 from the third conductive portion 53 to the fourth conductive portion 54 crosses a first device direction De1 from the first conductive portion 51 to the second conductive portion 52. The first element direction De1 may be, for example, the opposite direction of the first direction D1. The third conductive portion 53 and the fourth conductive portion 54 extend along a third element direction De3. The third device direction De3 crosses a plane including the first device direction De1 and the second device direction De2.

As already explained, one of the plurality of semiconductor devices 15 includes a semiconductor member 15s. As shown in FIG. 4, the semiconductor member 15s includes a first semiconductor region 11a of a first conductivity type, a second semiconductor region 11b of a second conductivity type, a third semiconductor region 11c of the first conductivity type, and a fourth semiconductor region 11d of the second conductivity type.

The fourth semiconductor region 11d is located between the first conductive portion 51 and the first semiconductor region 11a in the first device direction De1. The first semiconductor region 11a includes a first partial region r1, a second partial region r2, a third partial region r3 and a fourth partial region r4. The first partial region r1 is located between the fourth semiconductor region 11d and the third conductive portion 53 in the first device direction De1. The second partial region r2 is located between the fourth semiconductor region 11d and the fourth conductive portion 54 in the first device direction De1.

The third partial region r3 is located between the first partial region r1 and the second partial region r2 in the second device direction De2. The fourth partial region r4 is located between the third partial region r3 and the third semiconductor region 11c in the first device direction De1. The second semiconductor region 11b is located between the fourth partial region r4 and the third semiconductor region 11c in the first device direction De1.

A direction from the third conductive portion 53 to the fourth partial region r4, the second semiconductor region 11b, and the third semiconductor region 11c is along the second device direction De2. The second semiconductor region 11b is located between the third conductive portion 53 and the fourth conductive portion 54 in the second device direction De2.

The first conductive portion 51 is electrically connected to the fourth semiconductor region 11d. The second conductive portion 52 is electrically connected to the third semiconductor region 11c.

The element insulating portion 11i is provided between the semiconductor member 15s and the third conductive portion 53, between the semiconductor member 15s and the fourth conductive portion 54, between the third conductive portion 53 and the second semiconductor region 11b, and between the second semiconductor region 11b and the fourth conductive portion 54. The element insulating portion 11i may be provided between the third conductive portion 53 and the third semiconductor region 11c.

The first conductive portion 51 is electrically connected to the first electrode 15p. The second conductive portion 52 is electrically connected to the second electrode 15q. The third conductive portion 53 is electrically connected to the first control electrode 15a. The fourth conductive portion 54 is electrically connected to the second control electrode 15b.

The first conductivity type is one of n-type and p-type. The second conductivity type is the other one of n-type and p-type. Hereinafter, it is assumed that the first conductivity type is the n-type and the second conductivity type is the p-type.

The first semiconductor region 11a includes, for example, an $n^-$-region. An n-region may be provided between the first semiconductor region 11a and the second semiconductor region 11b. The second semiconductor region 11b includes, for example, a p-region. The third semiconductor region 11c includes, for example, an n-region. The fourth semiconductor region 11d includes, for example, a p-region. A first conductivity type impurity concentration (e.g., carrier concentration) in the third semiconductor region 11c is higher than a first conductivity type impurity concentration (e.g., carrier concentration) in the first semiconductor region 11a.

In this example, a fifth semiconductor region 11e being of the second conductivity type is provided. The fifth semiconductor region 11e is provided between the second semiconductor region 11b and the second conductive portion 52. A second conductivity type impurity concentration (e.g., carrier concentration) in the fifth semiconductor region 11e is higher than a second conductivity type impurity concentration (e.g., carrier concentration) in the second semiconductor region 11b. The fifth semiconductor region 11e is, for example, a $p^+$-region. A good electrical connection is obtained.

In this example, a sixth semiconductor region 11f of being of the first conductivity type is provided. The sixth semiconductor region 11f is provided between the fourth semiconductor region 11d and the first semiconductor region 11a. A first conductivity type impurity concentration (e.g., carrier concentration) in the sixth semiconductor region 11f is higher than the first conductivity type impurity concentration (e.g., carrier concentration) in the first semiconductor region 11a. The sixth semiconductor region 11f is, for example, an n-region. A good electrical connection is obtained.

As shown in FIG. 4, a plurality of third conductive portions 53 and a plurality of fourth conductive portions 54 are provided. The number (density) of the plurality of fourth conductive portions 54 may be greater than the number (density) of the plurality of third conductive portions 53.

Figure 5:
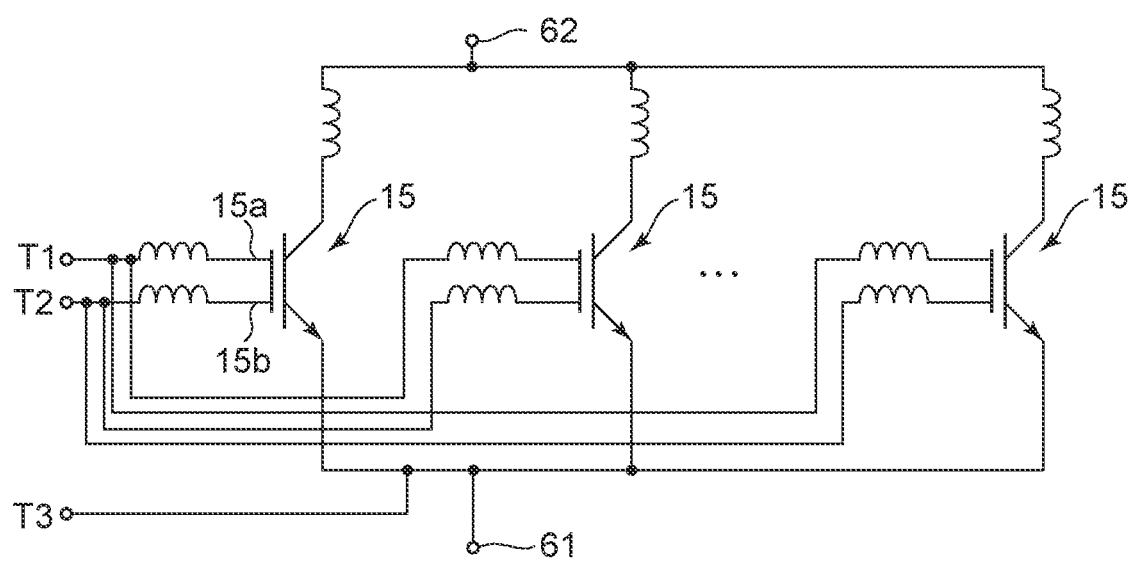
FIG. 5 is a circuit diagram illustrating the semiconductor package according to the first embodiment.

FIG. 5 is a circuit diagram illustrating the semiconductor package according to the first embodiment.

As shown in FIG. 5, the plurality of semiconductor devices are connected in parallel. A current flowing between the first conductive member 61 and the second conductive member 62 is controlled by signals supplied to the first terminal T1 and the second terminal T2.

Figure 6A:
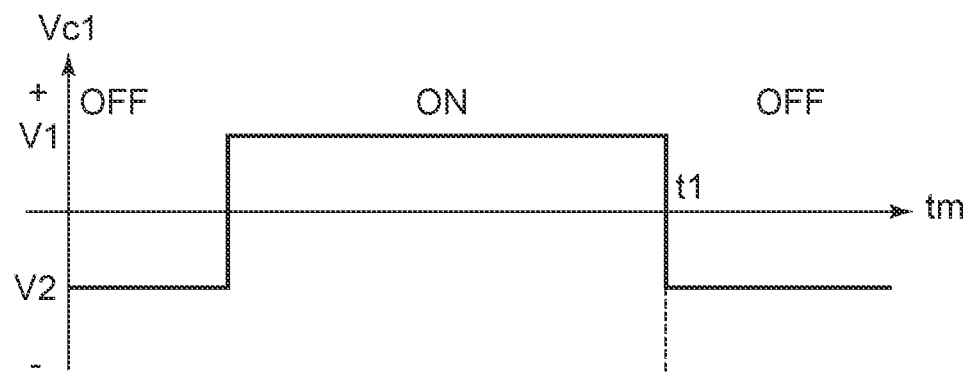
FIGS. 6A and 6B are schematic diagrams illustrating the operation of the semiconductor package according to the first embodiment.
Figure 6B:
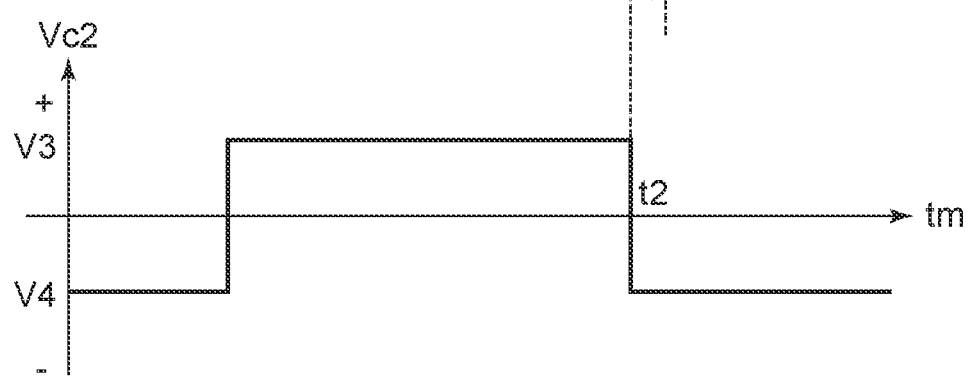

FIGS. 6A and 6B are schematic diagrams illustrating the operation of the semiconductor package according to the first embodiment.

FIG. 6A illustrates a potential Vc1 of the first terminal T1. FIG. 6B illustrates a potential Vc2 of the second terminal T2. These potentials may be potentials based on the potential of the third terminal T3. The horizontal axis of these figures is time tm.

As shown in FIG. 6A, a state where the potential Vc1 of the first terminal T1 relative to the potential of the third terminal T3 is the second potential V2 corresponds to an OFF state. A state where the potential Vc1 is the first potential V1 corresponds to an ON state. The second potential V2 is lower than the first potential V1. For example, the second potential V2 is negative and the first potential V1 is positive. The potential Vc1 is changed from the first potential V1 to the second potential V2 to form the OFF state.

In the OFF operation in which the potential Vc1 of the first terminal T1 changes from the first potential V1 to the second potential V2, the time at which the potential Vc1 changes from the first potential V1 to the second potential V2 is defined as a first time t1.

As shown in FIG. 6B, the potential Vc2 of the second terminal T2 based on the potential of the third terminal T3 can change from a third potential V3 to a fourth potential V4. The fourth potential V4 is lower than the third potential V3. For example, the fourth potential V4 is negative and the third potential is positive.

As shown in FIGS. 6A and 6B, the potential Vc2 of the second terminal T2 changes from the third potential V3 to the fourth potential V4 before the first time t1. Thereby, for example, carriers accumulated in the semiconductor member 15s can be effectively discharged. Thereby, for example, loss at turn-off can be reduced.

Such potential control (signal control) may be performed by a controller connected to the semiconductor package 110. The semiconductor package 110 may include a controller configured to perform such potential control (signal control).

Figure 7:
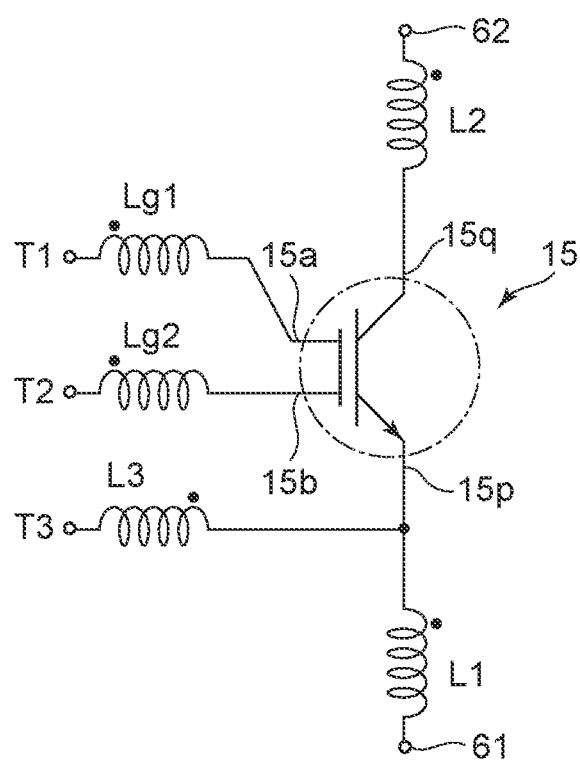
FIG. 7 is a circuit diagram illustrating a part of the semiconductor package according to the first embodiment.

FIG. 7 is a circuit diagram illustrating a part of the semiconductor package according to the first embodiment.

FIG. 7 illustrates one of the plurality of semiconductor devices 15. As shown in FIG. 7, the first electrode 15p is electrically connected to the first conductive member 61. The second electrode 15q is electrically connected to the second conductive member 62. The first control electrode 15a is electrically connected to the first terminal T1. The second control electrode 15b is electrically connected to the second terminal T2. The first electrode 15p is electrically connected to the third terminal T3 For example, a parasitic inductance L1 exists in the current path between the first electrode 15p and the first conductive member 61. For example, a parasitic inductance L2 exists in the current path between the second electrode 15q and the second conductive member 62. A parasitic inductance Lg1 exists in the current path between the first control electrode 15a and the first terminal T1. A parasitic inductance Lg2 exists in the current path between the second control electrode 15b and the second terminal T2. A parasitic inductance L3 exists in the current path between the first electrode 15p and the third terminal T3.

A mutual inductance is generated between the parasitic inductance Lg1 and the parasitic inductance Lg2. A mutual inductance is generated between the parasitic inductance Lg1 and the parasitic inductance L3. A mutual inductance is generated between the parasitic inductance Lg2 and the parasitic inductance L3.

Further, a mutual inductance is generated between the parasitic inductance Lg1 and the parasitic inductance L1. A mutual inductance is generated between the parasitic inductance Lg1 and the parasitic inductance L2.

A mutual inductance is generated between the parasitic inductance Lg2 and the parasitic inductance L1. A mutual inductance is generated between the parasitic inductance Lg2 and the parasitic inductance L2.

In the plurality of semiconductor devices 15, by parasitic inductances and mutual inductances being uniform, uniform operation is easily obtained. In the embodiment, by the wiring member 20 being is used, these inductances can be made small and uniform. For example, the signal delay can be uniform.

For example, the parasitic inductance Lg1 causes a transmission delay in the control signal supplied to the first control electrode 15a. The parasitic inductance Lg2 causes a transmission delay in the control signal supplied to the second control electrode 15b. The difference in these parasitic inductances causes a difference in the transmission delay of these control signals. The difference in transmission delay may cause operation error.

In the embodiment, by the above-described wiring member 20, the wiring length can easily be made uniform in the plurality of semiconductor devices 15. For example, the difference in parasitic inductance can be reduced.

The mutual inductance generates an induced voltage caused by the time change (dI/dt) of the signal supplied to the control electrode. There is a case where the operation error or current oscillation is generated by the induced voltage due to mutual inductance.

For example, in the case where the third wiring layer 23 is provided between the first wiring layer 21 and the second wiring layer 22, for example, a magnetic field generated by a current flowing through the first wiring layer 21 and a magnetic field generated by a current flowing through the second wiring layer 22 cancel each other. As a result, mutual inductance can be can be effectively suppressed.

According to the embodiment, the wiring length can easily be made uniform in the plurality of semiconductor devices 15. Variation in parasitic inductance can be reduced. For example, mutual inductance can be suppressed. The operation error can be suppressed more.

Second Embodiment

Figure 8:
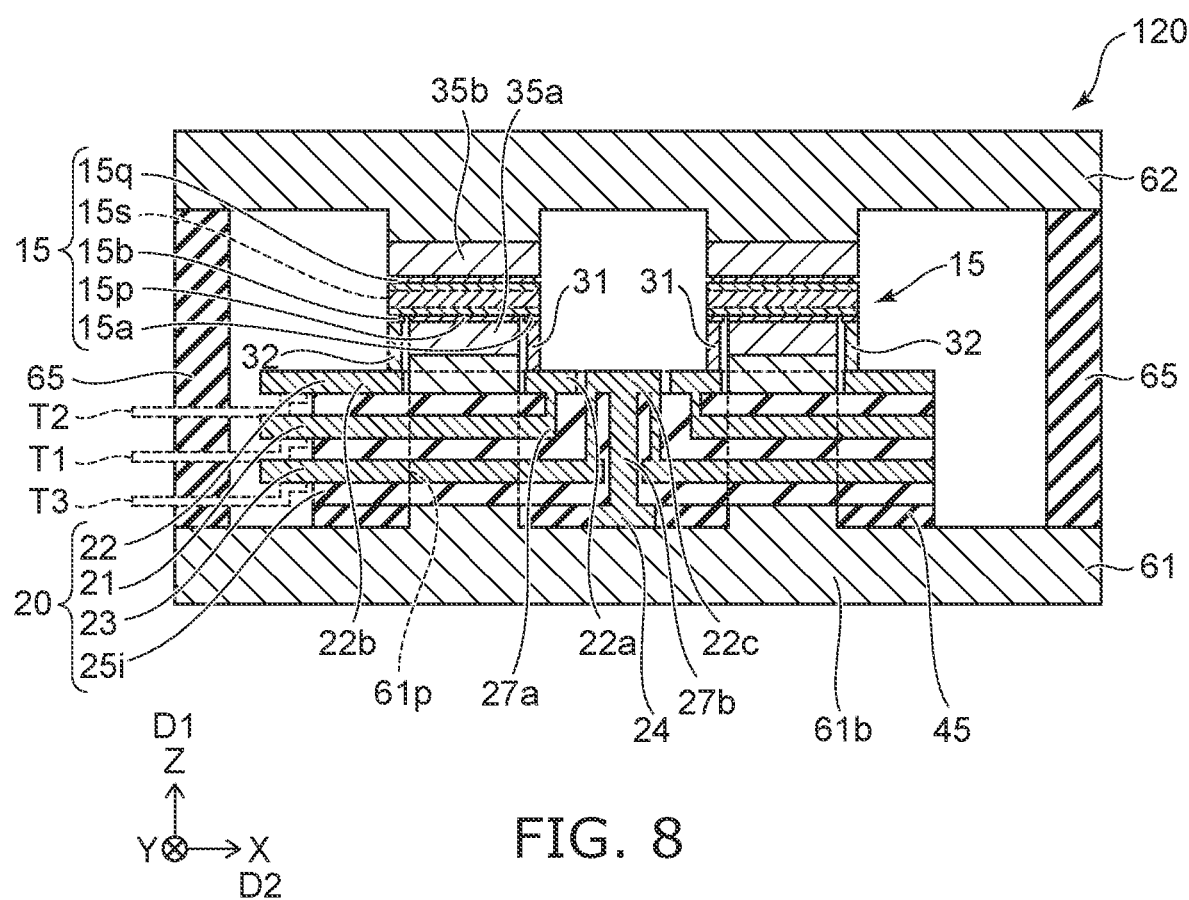
FIG. 8 is a schematic cross-sectional view illustrating a semiconductor package according to a second embodiment.
Figure 9:
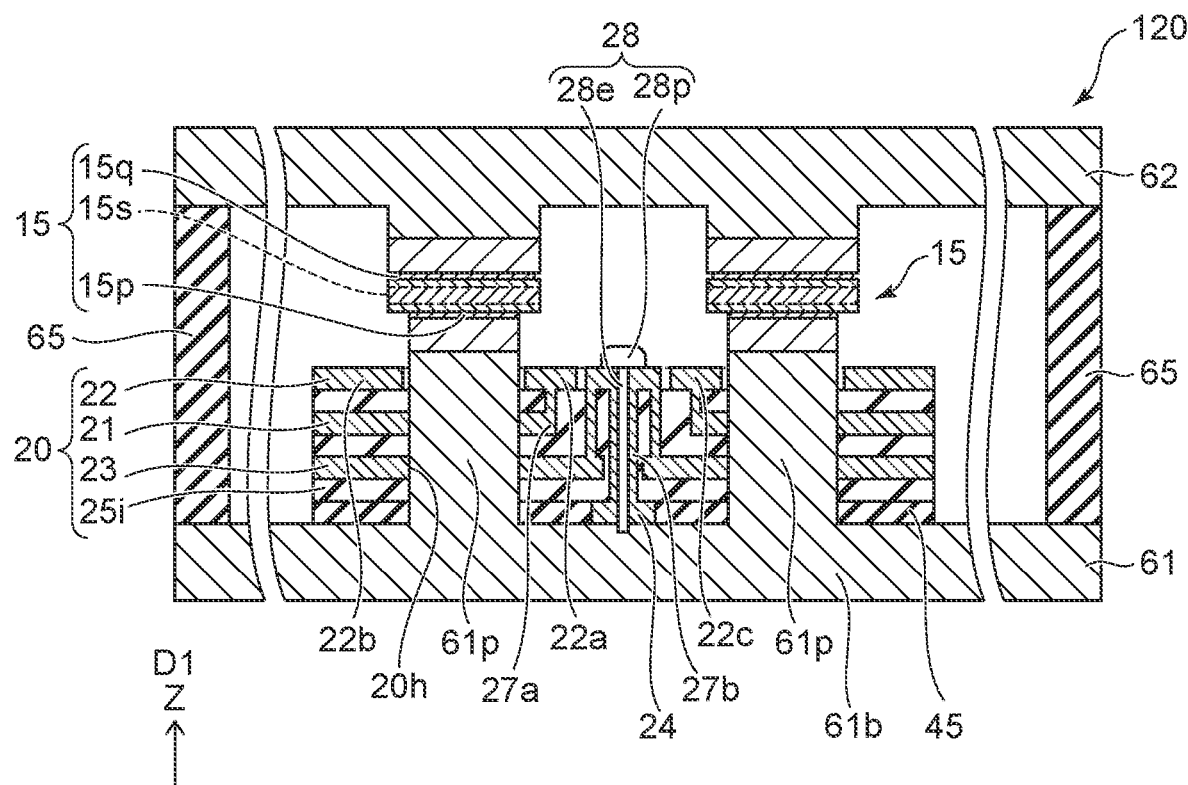
FIG. 9 is a schematic cross-sectional view illustrating a semiconductor package according to the second embodiment.

FIGS. 8 and 9 are schematic cross-sectional views illustrating a semiconductor package according to the second embodiment.

FIG. 8 is a cross-sectional view corresponding to the line A1-A2 of FIG. 2. FIG. 9 is a cross-sectional view corresponding to the line B1-B2 of FIG. 2.

As shown in FIG. 8, in a semiconductor package 120 according to the embodiment, the configuration of the wiring member 20 is different from the configuration of the wiring member 20 in the semiconductor package 110. a Except for this, the configuration of the semiconductor package 120 may be the same as the configuration of the semiconductor package 110.

As shown in FIG. 8, in the semiconductor package 120, the wiring member 20 includes the first wiring layer 21, the second wiring layer 22, the third wiring layer 23, and then insulating region 25i. As shown in FIG. 8, the position of the second wiring layer 22 in the first direction D1 is between the position of the third wiring layer 23 in the first direction D1 and the position of the plurality of semiconductor devices 15 in the first direction D1. The position of the first wiring layer 21 in the first direction D1 is between the position of the third wiring layer 23 in the first direction D1 and the position of the second wiring layer 22 in the first direction D1.

In such a semiconductor package 120 as well, it is easy to make the wiring length uniform in the plurality of semiconductor devices 15. Variation in parasitic inductance can be reduced. A semiconductor package with stable characteristics can be provided.

As described with reference to FIG. 6, the potential Vc2 of the second terminal T2 is changed from the third potential V3 to the fourth potential V4 before the first time t1 of the OFF operation. As a result, for example, carriers accumulated in the semiconductor member 15s can be effectively discharged, thereby reducing loss in the turn-off. By making the number of the plurality of fourth conductive portions 54 larger than the number of the plurality of third conductive portions 53, carriers can be discharged more effectively.

In the case where the number of the plurality of fourth conductive portions 54 is greater than the number of the plurality of third conductive portions 53, the capacitance of the second control electrode 15b is greater than the capacitance of the first control electrode 15a. In such a case, by the second wiring layer 22 connected to the second control electrode 15b having a large capacitance being close to the semiconductor device 15, distortion of the waveform can be further suppressed. For example, the second wiring layer 22 is located between the first wiring layer 21 and the multiple semiconductor devices 15. A more stable operation can be obtained.

Examples of semiconductor packages according to embodiments will be described below.

FIGS. 10 to 15 are schematic diagrams illustrating the semiconductor package according to the embodiment.

Figure 11:
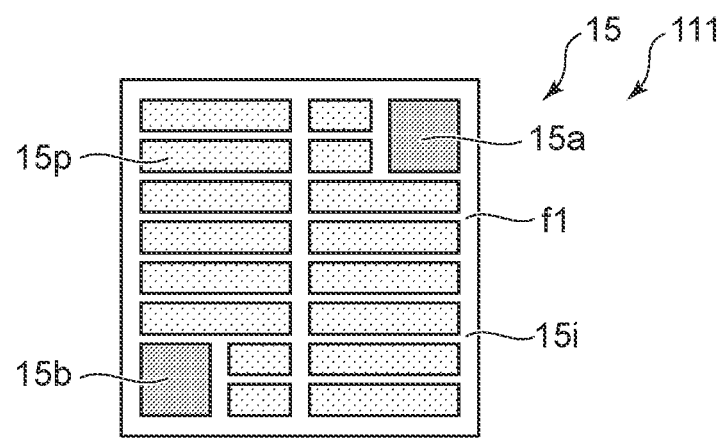
FIG. 11 is a schematic plan view illustrating a semiconductor package according to the second embodiment.
Figure 12:
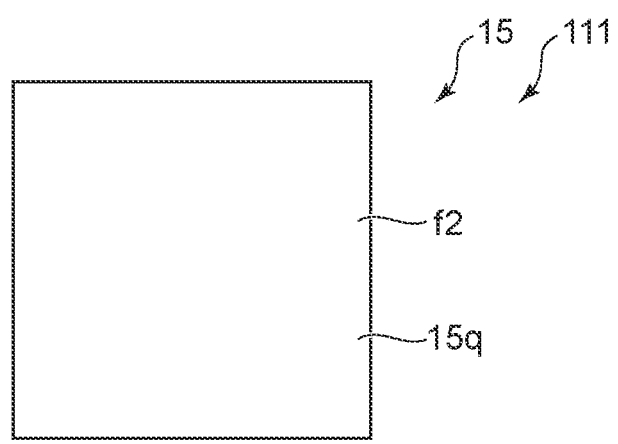
FIG. 12 is a schematic plan view illustrating a semiconductor package according to the second embodiment.

FIGS. 10, 13A, 13B, 14 and 15 are cross-sectional views. FIGS. 11 and 12 are plan views.

Figure 10:
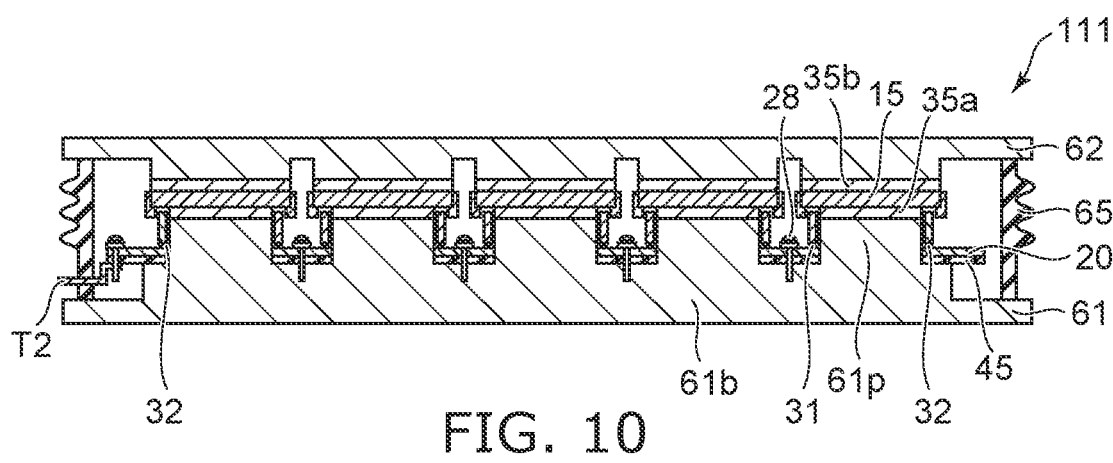
FIG. 10 is a schematic cross-sectional view illustrating a semiconductor package according to the second embodiment.

As shown in FIG. 10, a semiconductor package 111 according to the embodiment has the same configuration as the semiconductor package 110. The second terminal T2 passes through the insulating member 65 and is exposed to the outside.

FIG. 11 illustrates the first face f1 of the semiconductor package 111. The first electrode 15p, the first control electrode 15a and the second control electrode 15b are provided at the first face f1. These electrodes are not covered with the element insulating member 15i. A plurality of first electrodes 15p may be provided.

Figure 13A:
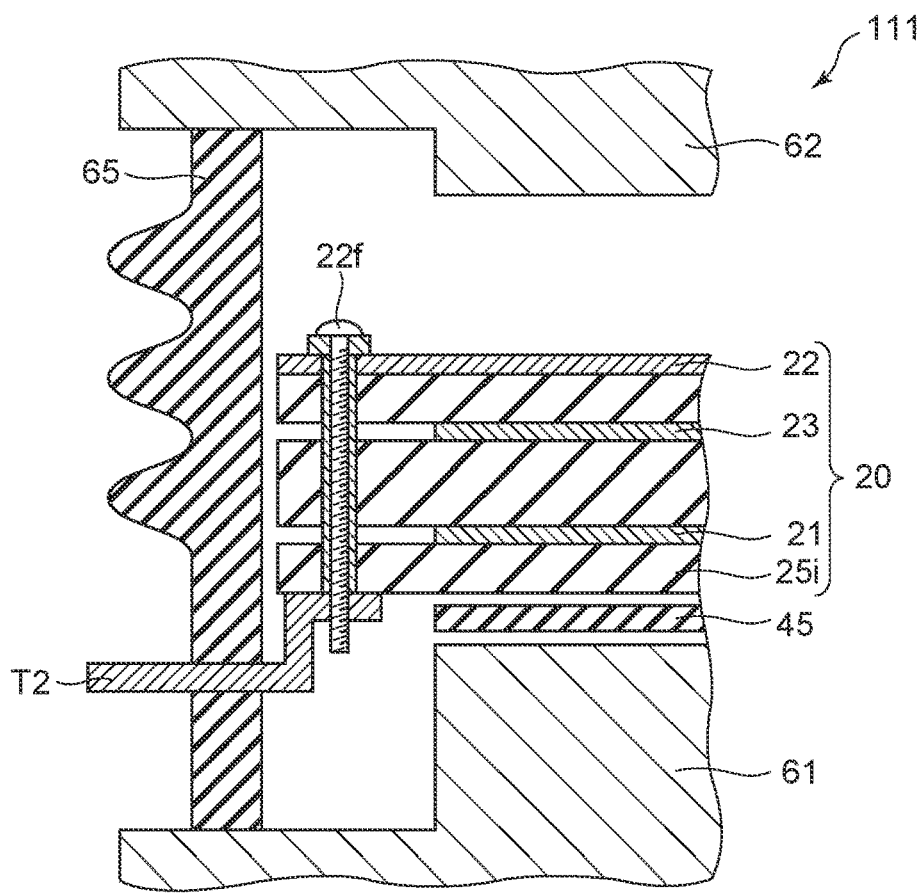
FIGS. 13A and 13B are schematic cross-sectional views illustrating a semiconductor package according to the second embodiment.
Figure 13B:
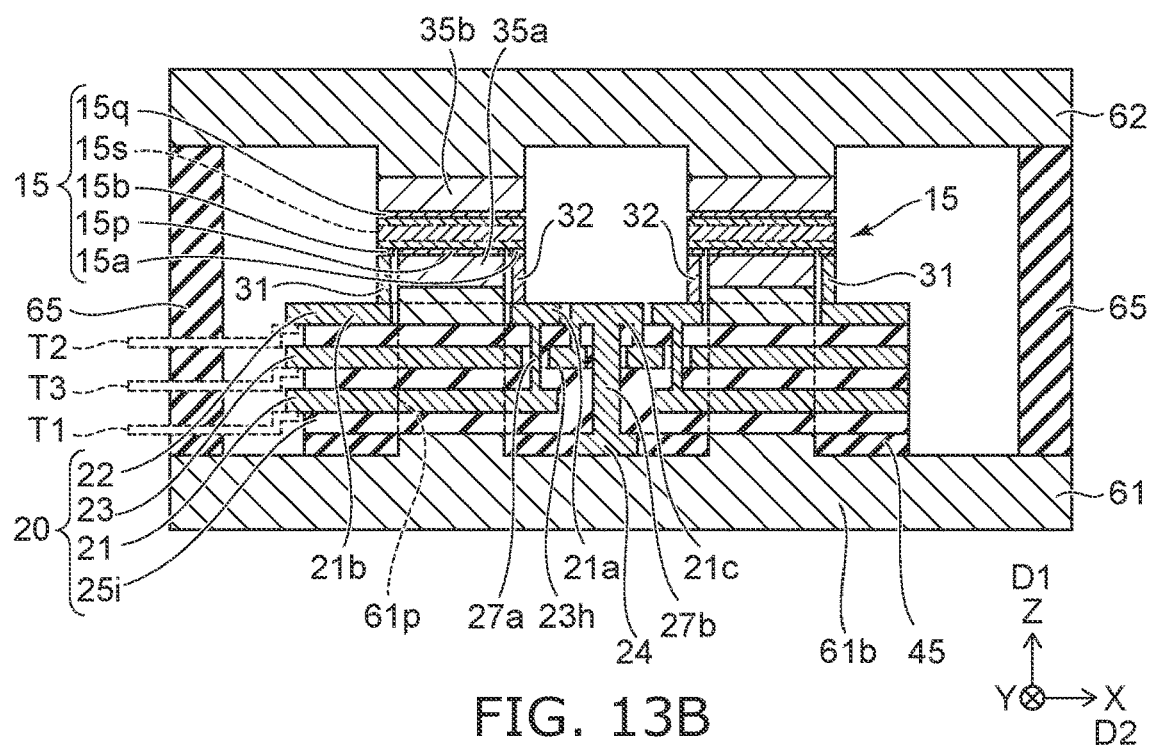
Figure 14:
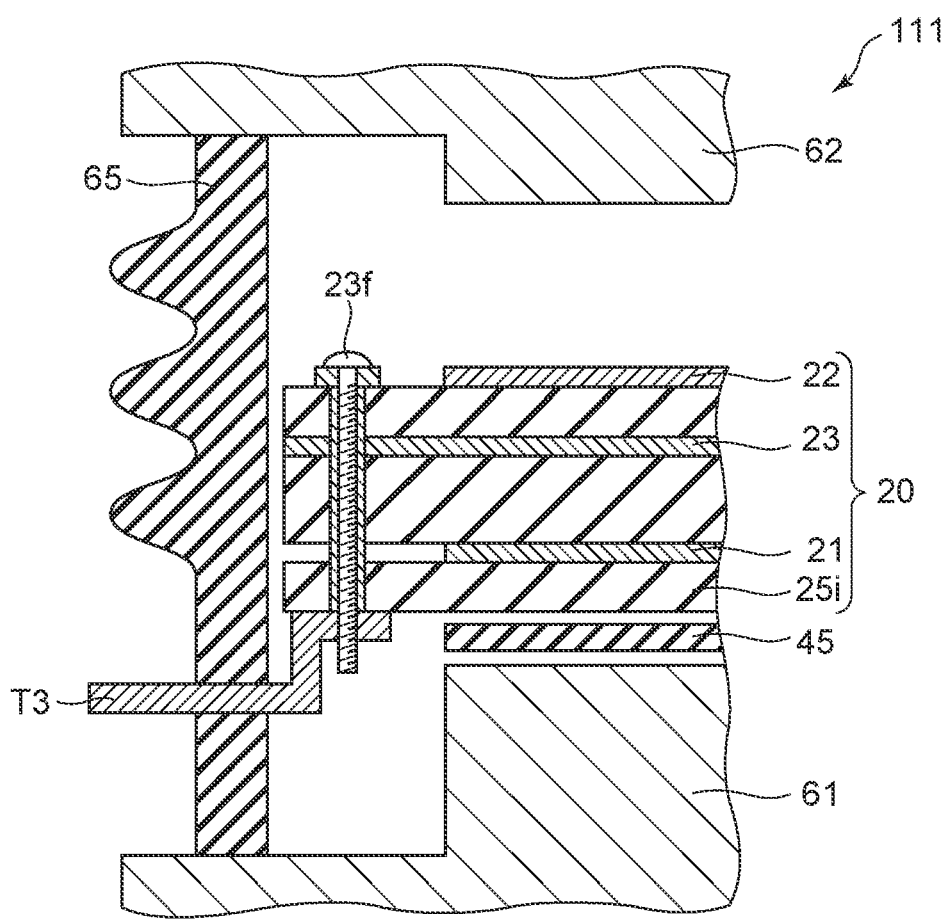
FIG. 14 is a schematic cross-sectional view illustrating a semiconductor package according to the second embodiment.
Figure 15:
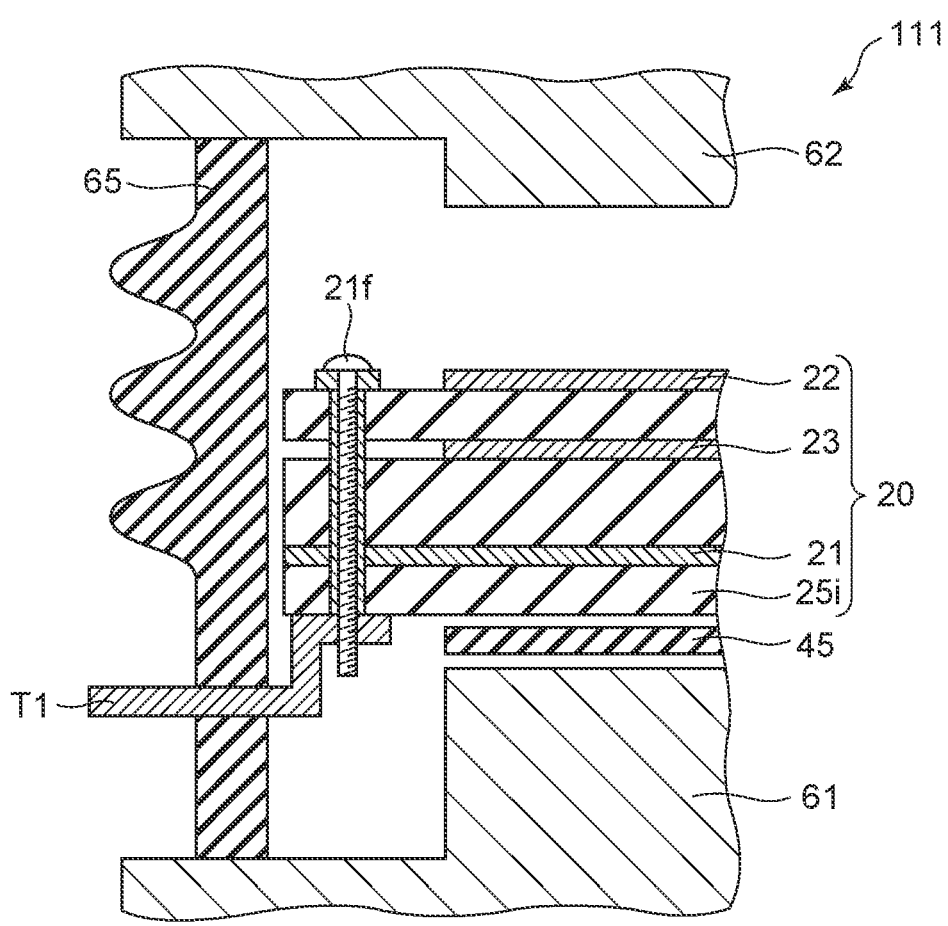
FIG. 15 is a schematic cross-sectional view illustrating a semiconductor package according to the second embodiment.

FIG. 12 illustrates the second face f2 of the semiconductor package 111. The second electrode 15q is provided at the second face f2. FIGS. 13A, 14 and 15 each illustrate a portion of the outer edge of the semiconductor package 111. As shown in FIG. 13A, the second terminal T2 is electrically connected to the second wiring layer 22 by the fixing member 22f. As shown in FIG. 14, the third terminal T3 is electrically connected to the third wiring layer 23 by the fixing member 23f. As shown in FIG. 15, the first terminal T1 is electrically connected to the first wiring layer 21 by the fixing member 21f. The fixing member 21f, the fixing member 22f and the fixing member 23f are, for example, conductive screws. As shown in FIG. 13B, third wiring layer 23 may be located between the first wiring layer 21 and the second wiring layer 22.

Figure 16:
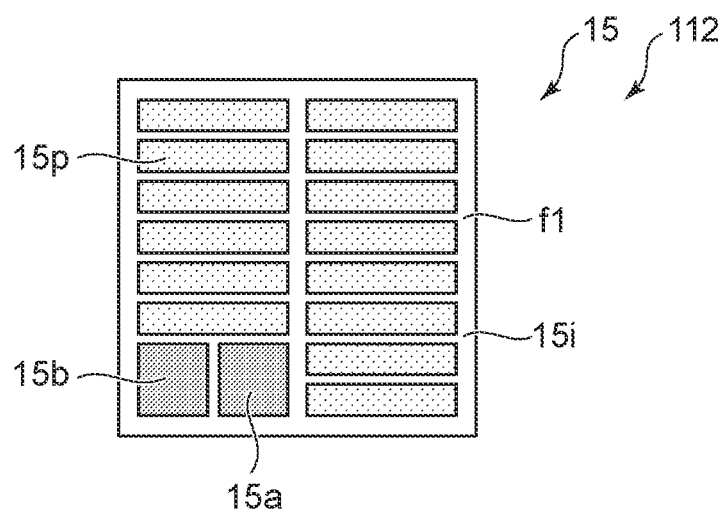
FIG. 16 is a schematic plan view illustrating a part of the semiconductor package according to the embodiment.
Figure 17:
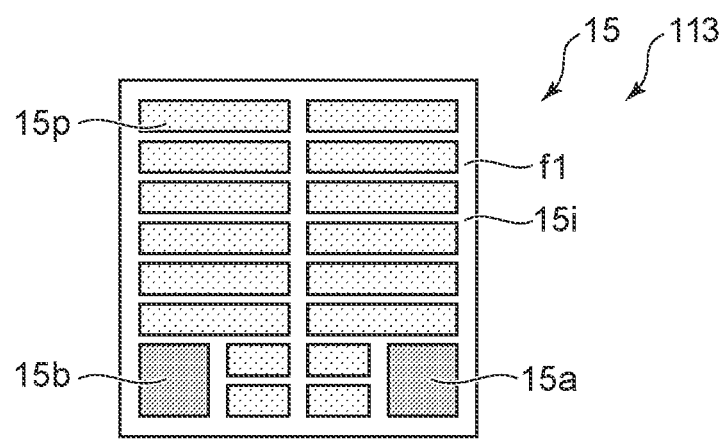
FIG. 17 is a schematic plan view illustrating a part of the semiconductor package according to the embodiment.
Figure 18:
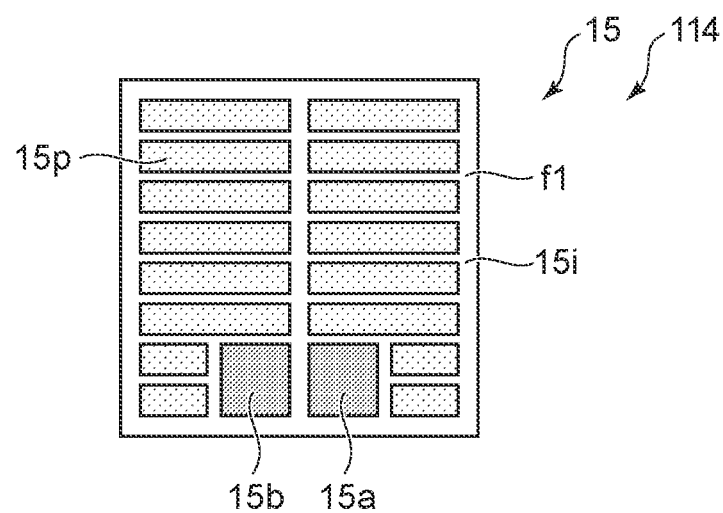
FIG. 18 is a schematic plan view illustrating a part of the semiconductor package according to the embodiment.

FIGS. 16 to 18 are schematic plan views illustrating a part of the semiconductor package according to the embodiment.

These figures illustrate the first face f1. As shown in FIG. 16, in a semiconductor package 112 according to the embodiment, the second control electrode 15b is provided next to the first control electrode 15a. These control electrodes are provided at corner portions of the semiconductor device 15.

As shown in FIG. 17, in a semiconductor package 113 according to the embodiment, the second control electrode 15b is provided along one side of the semiconductor device 15 and separated from the first control electrode 15a.

As shown in FIG. 18, in a semiconductor package 114 according to the embodiment, the second control electrode 15b is provided next to the first control electrode 15a. These control electrodes are provided at the center of one side of the semiconductor device 15.

Figure 19:
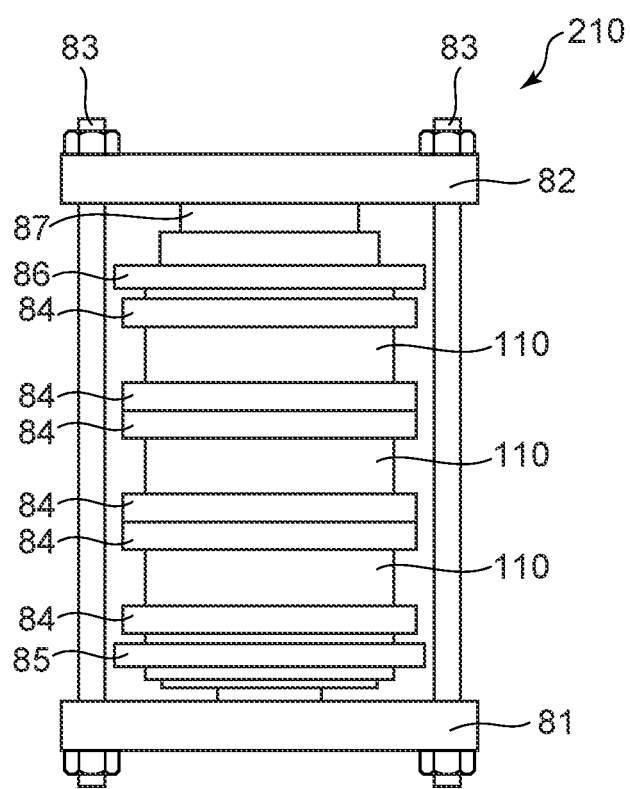
FIG. 19 is a schematic side view illustrating a state of use of the semiconductor package according to the embodiment.

FIG. 19 is a schematic side view illustrating a state of use of the semiconductor package according to the embodiment.

As shown in FIG. 19, a plurality of semiconductor packages 110 may be stacked. The plurality of semiconductor packages 110 are provided between a first plate 81 and a second plate 82. A cooling fin 84 may be provided between the plurality of semiconductor packages 110. For example, an insulator 85 may be provided between the first plate 81 and the cooling fin 84. For example, an insulator 86 may be provided between the cooling fin 84 and the second plate 82. A spring 87 may be provided between the insulator 86 and the second plate 82. The first plate 81 and the second plate 82 may be fixed under pressure by fixing members 83 (for example, screws).

Embodiments may include the following configurations (e.g., technical proposals).

Configuration 1

A semiconductor package, comprising:
a first conductive member;
a second conductive member;
a plurality of semiconductor devices provided between the first conductive member and the second conductive member, one of the plurality of semiconductor devices including a semiconductor member, a first electrode provided between the first conductive member and the semiconductor member, a first control electrode provided between the first conductive member and the semiconductor member, a second control electrode provided between the first conductive member and the semiconductor member, and a second electrode provided between the semiconductor member and the second conductive member, the first conductive member being electrically connected to the first electrode, the second conductive member being electrically connected to the second electrode, a direction from the second control electrode to the first control electrode crossing a first direction from the first conductive member to the second conductive member;

a wiring member including a first wiring layer, a second wiring layer, a third wiring layer, and an insulating region, a direction from the first wiring layer to the second wiring layer and a direction from the first wiring layer to the third wiring layer being along the first direction, at least a part of the insulating region being located between the first wiring layer and the third wiring layer, and between the third wiring layer and the second wiring layer, a position of the second wiring layer in the first direction being between a position of the insulating region in the first direction and a position of the plurality of semiconductor devices in the first direction, the second wiring layer including a first connection region and a second connection region, the first connection region being electrically connected to the first wiring layer, the third wiring layer being electrically connected to the first conductive member;

a first connection member provided between the first connection region and the first control electrode, the first connection member electrically connecting the first connection region to the first control electrode; and a second connection member provided between the second connection region and the second control electrode, the second connection member electrically connecting the second connection region to the second control electrode.

Configuration 2

The semiconductor package according to Configuration 1, wherein
the position of the second wiring layer in the first direction is between a position of the first wiring layer in the first direction and the position of the plurality of semiconductor devices in the first direction, and
a position of the third wiring layer in the first direction is between the position of the first wiring layer in the first direction and the position of the second wiring layer in the first direction.

Configuration 3

The semiconductor package according to Configuration 2, wherein a distance between the first wiring layer and the third wiring layer along the first direction is not less than 0.3 times and not more than 3.0 times of a distance between the third wiring layer and the second wiring layer along the first direction.

Configuration 4

The semiconductor package according to Configuration 2 or 3, wherein
the wiring member further includes a first connecting portion;
the first connecting portion electrically connects the first wiring layer to the first connection region, and
at least a part of the first connecting portion extends in the first direction in the insulating region.

Configuration 5 The semiconductor package according to Configuration 4, wherein
the third wiring layer includes a third wiring layer hole, and
the first connecting portion passes through the third wiring layer hole.

Configuration 6

The semiconductor package according to Configuration 1, wherein
the position of the second wiring layer in the first direction is between a position of the third wiring layer in the first direction and the position of the plurality of semiconductor devices in the first direction, and
a position of the first wiring layer in the first direction is between the position of the third wiring layer in the first direction and the position of the second wiring layer in the first direction.

Configuration 7

The semiconductor package according to Configuration 6, wherein a capacitance of the second control electrode is larger than a capacitance of the first control electrode.

Configuration 8

The semiconductor package according to any one of Configurations 1 to 7, wherein
the first conductive member includes a first base portion and a first protruding portion connected to the first base portion,
the wiring member includes a wiring member hole, and
the first protruding portion passes through the wiring member hole.

Configuration 9

The semiconductor package according to Configuration 8, further comprising:
a first conductive plate; and
a second conductive plate,
the first conductive plate being located between the first protruding portion and the first electrode, and
the second conductive plate being between the second electrode and the second conductive member.

Configuration 10

The semiconductor package according to Configuration 8 or 9, further comprising
an insulating plate,
the insulating plate being provided between the first base portion and the wiring member.

Configuration 11

The semiconductor package according to any one of Configurations 1 to 10, wherein
the wiring member further includes a second connecting portion and a fourth wiring layer,
the first wiring layer further includes a third connection region,
the insulating region is located between the fourth wiring layer and the third connection region in the first direction,
the second connecting portion extends in the insulating region along the first direction, and
the second connecting portion electrically connects the fourth wiring layer to the third connection region.

Configuration 12

The semiconductor package according to Configuration 11, further comprising
a fixing member,
the fixing member including a first fixing portion and a first fixing extension portion,
the first fixing extension portion being connected with the first fixing portion,
the fourth wiring layer, the second connecting portion, and the third connection region being located between a part of the first conductive member and the first fixing portion in the first direction, the first fixing extension portion passing through the fourth wiring layer, the second connecting portion, and the third connection region in the first direction, and the first fixing extension portion being fixed to the part of the first conductive member.

Configuration 13

The semiconductor package according to Configuration 12, wherein the fixing member is a screw.

Configuration 14

The semiconductor package according to any one of Configurations 1 to 13, wherein the first connection member and the second connection member are elastic members.

Configuration 15

The semiconductor package according to any one of Configurations 1 to 14, wherein the one of the plurality of semiconductor devices is an IGBT, the first electrode functions as an emitter electrode, the second electrode functions as a collector electrode, and a current flowing between the first electrode and the second electrode is configured to be controlled by a potential of at least one of the first control electrode or the second control electrode.

Configuration 16

The semiconductor package according to any one of Configurations 1 to 15, further comprising an insulating member, the insulating member being provided around the plurality of semiconductor devices in a plane crossing the first direction, and at least a part of the insulating member being located between the first conductive member and the second conductive member.

Configuration 17

The semiconductor package according to Configuration 16, further comprising:

a first terminal electrically connected to the first wiring layer;

a second terminal electrically connected to the second wiring layer; and a third terminal electrically connected to the third wiring layer, at least one of the first terminal, the second terminal or the third terminal passing through the insulating member in a direction crossing the first direction.

Configuration 18

The semiconductor package according to Configuration 17, wherein in an off operation in which a potential of the first terminal based on a potential of the third terminal changes from a first potential to a second potential, a potential of the second terminal based on the potential of the third terminal changes from a third potential to a fourth potential before a first time of a change from the first potential to the second potential, the second potential is lower than the first potential, and the fourth potential is lower than the third potential.

Configuration 19

The semiconductor package according to any one of Configurations 1 to 18, wherein the one of the plurality of semiconductor devices includes a first conductive portion, a second conductive portion, a third conductive portion, a fourth conductive portion, and an element insulating portion, a second element direction from the third conductive portion to the fourth conductive portion crosses a first element direction from the first conductive portion to the second conductive portion, the semiconductor member includes a first semiconductor region of a first conductivity type, a second semiconductor region of a second conductivity type, a third semiconductor region of the first conductivity type, and a fourth semiconductor region of the second conductivity type, the fourth semiconductor region is located between the first conductive portion and the first semiconductor region in the first element direction, the first semiconductor region includes a first partial region, a second partial region, a third partial region, and a fourth partial region, the first partial region is located between the fourth semiconductor region and the third conductive portion in the first element direction, the second partial region is located between the fourth semiconductor region and the fourth conductive portion in the first element direction, the third partial region is located between the first partial region and the second partial region in the second element direction, the fourth partial region is located between the third partial region and the third semiconductor region in the first element direction, the second semiconductor region is located between the fourth partial region and the third semiconductor region in the first element direction, a direction from the third conductive portion to the fourth partial region, the second semiconductor region, and the third semiconductor region is along the second element direction, the second semiconductor region is located between the third conductive portion and the fourth conductive portion in the second element direction, the first conductive portion is electrically connected to the fourth semiconductor region, the second conductive portion is electrically connected to the third semiconductor region, and the element insulating portion is provided between the semiconductor member and the third conductive portion, between the semiconductor member and the fourth conductive portion, between the third conductive portion and the second semiconductor region, and between the second semiconductor region and the fourth conductive portion.

Configuration 20

The semiconductor package according to any one of Configurations 1 to 19, wherein a stress in a direction from the first conductive member to the plurality of semiconductor devices and a stress in a direction from the second conductive member to the plurality of semiconductor devices are applied to the plurality of semiconductor devices.

According to the embodiment, a semiconductor package capable of obtaining stable characteristics can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor packages such as conductive members, semiconductor devices, wiring members and connection members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor packages practicable by an appropriate design modification by one skilled in the art based on the semiconductor packages described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor package, comprising:
a first conductive member;
a second conductive member;
a plurality of semiconductor devices provided between the first conductive member and the second conductive member, one of the plurality of semiconductor devices including a semiconductor member, a first electrode provided between the first conductive member and the semiconductor member, a first control electrode provided between the first conductive member and the semiconductor member, a second control electrode provided between the first conductive member and the semiconductor member, and a second electrode provided between the semiconductor member and the second conductive member, the first conductive member being electrically connected to the first electrode, the second conductive member being electrically connected to the second electrode, a direction from the second control electrode to the first control electrode crossing a first direction from the first conductive member to the second conductive member;
a wiring member including a first wiring layer, a second wiring layer, a third wiring layer, and an insulating region, a direction from the first wiring layer to the second wiring layer and a direction from the first wiring layer to the third wiring layer being along the first direction, at least a part of the insulating region being located between the first wiring layer and the third wiring layer, and between the third wiring layer and the second wiring layer, a position of the second wiring layer in the first direction being between a position of the insulating region in the first direction and a position of the plurality of semiconductor devices in the first direction, the second wiring layer including a first connection region and a second connection region, the first connection region being electrically connected to the first wiring layer, the third wiring layer being electrically connected to the first conductive member;
a first connection member provided between the first connection region and the first control electrode, the first connection member electrically connecting the first connection region to the first control electrode; and
a second connection member provided between the second connection region and the second control electrode, the second connection member electrically connecting the second connection region to the second control electrode.

2. The package according to claim 1, wherein
the position of the second wiring layer in the first direction is between a position of the first wiring layer in the first direction and the position of the plurality of semiconductor devices in the first direction, and
a position of the third wiring layer in the first direction is between the position of the first wiring layer in the first direction and the position of the second wiring layer in the first direction.

3. The package according to claim 2, wherein a distance between the first wiring layer and the third wiring layer along the first direction is not less than 0.3 times and not more than 3.0 times of a distance between the third wiring layer and the second wiring layer along the first direction.

4. The package according to claim 2, wherein
the wiring member further includes a first connecting portion;
the first connecting portion electrically connects the first wiring layer to the first connection region, and
at least a part of the first connecting portion extends in the first direction in the insulating region.

5. The package according to claim 4, wherein
the third wiring layer includes a third wiring layer hole, and
the first connecting portion passes through the third wiring layer hole.

6. The package according to claim 1, wherein
the position of the second wiring layer in the first direction is between a position of the third wiring layer in the first direction and the position of the plurality of semiconductor devices in the first direction, and
a position of the first wiring layer in the first direction is between the position of the third wiring layer in the first direction and the position of the second wiring layer in the first direction.

7. The package according to claim 6, wherein a capacitance of the second control electrode is larger than a capacitance of the first control electrode.

8. The package according to claim 1, wherein
the first conductive member includes a first base portion and a first protruding portion connected to the first base portion,
the wiring member includes a wiring member hole, and
the first protruding portion passes through the wiring member hole.

9. The package according to claim 8, further comprising:
a first conductive plate; and
a second conductive plate,
the first conductive plate being located between the first protruding portion and the first electrode, and
the second conductive plate being between the second electrode and the second conductive member.

10. The package according to claim 8, further comprising an insulating plate,
the insulating plate being provided between the first base portion and the wiring member.

11. The package according to claim 1, wherein
the wiring member further includes a second connecting portion and a fourth wiring layer,
the first wiring layer further includes a third connection region,
the insulating region is located between the fourth wiring layer and the third connection region in the first direction,
the second connecting portion extends in the insulating region along the first direction, and
the second connecting portion electrically connects the fourth wiring layer to the third connection region.

12. The package according to claim 11, further comprising
a fixing member,
the fixing member including a first fixing portion and a first fixing extension portion,
the first fixing extension portion being connected with the first fixing portion,
the fourth wiring layer, the second connecting portion, and the third connection region being located between a part of the first conductive member and the first fixing portion in the first direction,
the first fixing extension portion passing through the fourth wiring layer, the second connecting portion, and the third connection region in the first direction, and
the first fixing extension portion being fixed to the part of the first conductive member.

13. The package according to claim 12, wherein the fixing member is a screw.

14. The package according to claim 1, wherein the first connection member and the second connection member are elastic members.

15. The package according to claim 1, wherein
the one of the plurality of semiconductor devices is an IGBT,
the first electrode functions as an emitter electrode,
the second electrode functions as a collector electrode, and
a current flowing between the first electrode and the second electrode is configured to be controlled by a potential of at least one of the first control electrode or the second control electrode.

16. The package according to claim 1, further comprising an insulating member,
the insulating member being provided around the plurality of semiconductor devices in a plane crossing the first direction, and
at least a part of the insulating member being located between the first conductive member and the second conductive member.

17. The package according to claim 16, further comprising:
a first terminal electrically connected to the first wiring layer;
a second terminal electrically connected to the second wiring layer; and
a third terminal electrically connected to the third wiring layer,
at least one of the first terminal, the second terminal or the third terminal passing through the insulating member in a direction crossing the first direction.

18. The package according to claim 17, wherein
in an off operation in which a potential of the first terminal based on a potential of the third terminal changes from a first potential to a second potential, a potential of the second terminal based on the potential of the third terminal changes from a third potential to a fourth potential before a first time of a change from the first potential to the second potential,
the second potential is lower than the first potential, and
the fourth potential is lower than the third potential.

19. The package according to claim 1, wherein
the one of the plurality of semiconductor devices includes a first conductive portion, a second conductive portion, a third conductive portion, a fourth conductive portion, and an element insulating portion,
a second element direction from the third conductive portion to the fourth conductive portion crosses a first element direction from the first conductive portion to the second conductive portion,
the semiconductor member includes a first semiconductor region of a first conductivity type, a second semiconductor region of a second conductivity type, a third semiconductor region of the first conductivity type, and a fourth semiconductor region of the second conductivity type,
the fourth semiconductor region is located between the first conductive portion and the first semiconductor region in the first element direction,
the first semiconductor region includes a first partial region, a second partial region, a third partial region, and a fourth partial region,
the first partial region is located between the fourth semiconductor region and the third conductive portion in the first element direction,
the second partial region is located between the fourth semiconductor region and the fourth conductive portion in the first element direction,
the third partial region is located between the first partial region and the second partial region in the second element direction,
the fourth partial region is located between the third partial region and the third semiconductor region in the first element direction,
the second semiconductor region is located between the fourth partial region and the third semiconductor region in the first element direction,
a direction from the third conductive portion to the fourth partial region, the second semiconductor region, and the third semiconductor region is along the second element direction,
the second semiconductor region is located between the third conductive portion and the fourth conductive portion in the second element direction,
the first conductive portion is electrically connected to the fourth semiconductor region,
the second conductive portion is electrically connected to the third semiconductor region, and
the element insulating portion is provided between the semiconductor member and the third conductive portion, between the semiconductor member and the fourth conductive portion, between the third conductive portion and the second semiconductor region, and between the second semiconductor region and the fourth conductive portion.

20. The package according to claim 1, wherein a stress in a direction from the first conductive member to the plurality of semiconductor devices and a stress in a direction from the second conductive member to the plurality of semiconductor devices are applied to the plurality of semiconductor devices.

* * * * *